(12) United States Patent
Gilton et al.

(10) Patent No.: US 6,813,176 B2
(45) Date of Patent: Nov. 2, 2004

(54) METHOD OF RETAINING MEMORY STATE IN A PROGRAMMABLE CONDUCTOR RAM

(75) Inventors: Terry L. Gilton, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/701,106

(22) Filed: Nov. 5, 2003

(65) Prior Publication Data

US 2004/0071012 A1 Apr. 15, 2004

Related U.S. Application Data

(63) Continuation of application No. 09/941,648, filed on Aug. 30, 2001, now Pat. No. 6,646,902.

(51) Int. Cl.$^7$ .......................... G11C 17/00; G11C 11/00
(52) U.S. Cl. ...................... 365/100; 365/148; 365/163; 257/2; 257/3; 257/5
(58) Field of Search ................................ 365/100, 148, 365/163; 257/2, 3, 5

(56) References Cited

U.S. PATENT DOCUMENTS

| | | |
|---|---|---|
| 3,622,319 A | 11/1971 | Sharp |
| 3,743,847 A | 7/1973 | Boland |
| 4,266,338 A * | 5/1981 | Chen et al. ............. 29/623.2 |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,671,618 A | 6/1987 | Wu et al. |
| 4,795,657 A | 1/1989 | Formigoni et al. |
| 4,800,526 A | 1/1989 | Lewis |
| 4,847,674 A | 7/1989 | Sliwa et al. |
| 5,177,567 A | 1/1993 | Klersy et al. |

(List continued on next page.)

FOREIGN PATENT DOCUMENTS

| | | |
|---|---|---|
| JP | 56126916 | 10/1998 |
| WO | WO 97/48032 | 12/1997 |
| WO | WO 99/08914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

(List continued on next page.)

*Primary Examiner*—Son Mai
(74) *Attorney, Agent, or Firm*—Dickstein Shapiro Morin & Oshinsky LLP (57) ABSTRACT

A non-volatile memory device, such as a Programmable Conductor Random Access Memory (PCRAM) device, having an exemplary memory stored state retention characteristic is disclosed. There is provided a method for retaining stored states in a random access memory device generally comprising the steps of programming a memory cell or an array of memory cells by applying a first voltage to the cells and stabilizing the cells by applying a second voltage to the cells, which is less than the first voltage. The second voltage, which acts as a stabilizing voltage, may be a read-out voltage. The second voltage may also be continuously applied to the cells. The second voltage may also be provided as a sweep voltage, a pulse voltage, or a step voltage.

85 Claims, 4 Drawing Sheets

U.S. PATENT DOCUMENTS

| | | | |
|---|---|---|---|
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,314,772 A | 5/1994 | Kozicki | |
| 5,315,131 A | 5/1994 | Kishimoto et al. | |
| 5,350,484 A | 9/1994 | Gardner et al. | |
| 5,360,981 A | 11/1994 | Owen et al. | |
| 5,500,532 A | 3/1996 | Kozicki | |
| 5,512,328 A | 4/1996 | Yoshimura et al. | |
| 5,512,773 A | 4/1996 | Wolf et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | * 10/1998 | Harshfield | 365/105 |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,914,893 A | 6/1999 | Kozicki et al. | |
| 5,920,788 A | 7/1999 | Reinberg | |
| 5,998,066 A | 12/1999 | Block et al. | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | * 7/2000 | Kozicki et al. | 365/153 |
| 6,117,720 A | 9/2000 | Harshfield | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,440,837 B1 | 8/2002 | Harshfield | |
| 6,469,364 B1 | 10/2002 | Kozicki | |
| 6,473,332 B1 | 10/2002 | Ignatiev et al. | |
| 6,487,106 B1 | 11/2002 | Kozicki | |
| 6,560,155 B1 | * 5/2003 | Hush | 365/222 |
| 6,579,760 B1 | * 6/2003 | Lung | 438/257 |
| 6,635,914 B2 | 10/2003 | Kozicki | |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0049912 A1 | 3/2003 | Campbell et al. | |
| 2003/0068861 A1 | 4/2003 | Li | |
| 2003/0068862 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |

OTHER PUBLICATIONS

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Axon Technologies Corporation, Technology Description: *Programmable Metalization Cell(PMC)*, pp. 1–6 (Pre–May 2000).

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5l: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near x–1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid State comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17th (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfind Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of Ag2–xSe1+x/n–Si diodes, Thin Solid Films 110 (1983) 107–113.

El Gharras, Z.; Bourahla, A.; Vautier, C., Role of Photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, U.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shari, H.T., Electrical, thermal and optical properties of Se75Ge7Sb18, Vacuum 43 (1992) 253–257.

Feng, X. ;Bresser, W.J.; Boolchand, P., Directed evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) curently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.–P.; Rouxel, T.; Sangleboeuf, J.–C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the strucure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structuress, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells,* Arizona State University, pp. Title page–114 (UMI Company, May 1999).

Hirose et al., *High Speed Memory Behavior and Reliability of an Amorphous $As_2S_3$ Film Doped Ag,* Phys. Stat. Sol. (a) 61, pp. 87–90 (1980).

Hirose, Y., et al., "Polarity–dependent memory switching and behavior of Ag dendrite in Ag–photodoped amorphous As2S3 films", J. Appl. Phys. 47 (1976) 2767–2772.

Holmquist et al., *Reaction and Diffusion in Silver–Arsenic Chalcogenide Glass Systems,* 62 J. Amer. Ceram. Soc., No. 3–4, pp. 183–188 (Mar.–Apr. 1979).

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectroncis and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Huggett et al., Development of silver sensitized germanium selenide photoresist by reactive sputter etching in SF6, 42 Appl. Phys. Lett., No. 7, pp. 592–594 (Apr. 1983).

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi et al., *Mechanism of photosurface deposition*, 164–166 J. Non–Cryst. Solids, pp. 1231–1234 (1993).

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Kolobov et al., Photodoping of amorphous chalcogenides by metals, Advances in Physics, 1991, vol. 40, No. 5, pgs. 625–684.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Kozicki et al., Silver incorporation in thin films of selenium rich Ge–Se glasses, International Congress on Glass, vol. 2, Extended Abstracts, Jul. 2001, pgs. 8–9.

Michael N. Kozicki 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal–Doped Chalcogenides, Electrochemical Society Proceedings, vol. 99–13, 1999, pgs. 298–309.

Kozicki et al., Nanoscale effects in devices based on chalcogenide solid solutions, Superlattices and Microstructures, vol. 27, No. 516, 2000, pgs. 485–488.

Kozicki et al., Nanoscale phase separation in Ag–Ge–Se glasses, Microelectronic Engineering 63 (2002) pgs. 155–159.

Lakshminarayan, K.N.; Srivastava, K.K.; Panwar, O.S.; Dumar. A., Amorphous semiconductor devices: memory and switching mechanism, J. Instn Electronics & Telecom. Engrs 27 (1981) 16–19.

Lal, M.; Goyal N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett., 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

McHardy et al., *The dissolution of metals in amorphous chalcogenides and the effects o electron and ultraviolet radiation*, 20 J. Phys. C.: Solid State Phys., pp. 4055–4075 (1987)f.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitokova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Owen et al., Metal–Chalcogenide Photoresists for High Resolution Lithography and Sub–Micron Structures, Nanostructure Physics and Fabrication, pp. 447–451 (M. Reed ed. 1989).

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys 29 (1996) 2004–2008.

Rahman, S.; Silvarama Sastry, G., Electronic switching in Ge–Bi–Se–Te glasses, Mat. Sci. and Eng. B12 (1992) 219–222.

Ramesh, K.; Asokan. S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a–Si:H Memory devices, Mat. Res. Soc. Symp. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh. B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Shimizu et al., *The Photo–Erasable Memory Switching Effect of Ag Photo–Doped Chalcogenide Glasses,* 46 B. Chem Soc. Japan, No. 12, pp. 3662–3365 (1973).

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepares by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchang, P., Variation of glass transition temperature, Tg, with average coordination number, $<m>$, in network glasses: evidence of a threshold behavior in the slope $|dTg/d<m>|$ at the rigidity percolation threshold ($<m>=2.4$), J. Non–Cryst. Solids 151 (1992) 149–154.

Kawamoto, Yoji And Nishida, Masaru, Ionic Conduction In $As_2S_3$—$Ag_2S$, $GeS_2$—$GeS$—$Ag_2S$ And $P_2S_5$—$Ag_2S$ Glasses, Journal of Non–Crystalline Solids 20 (1976) 393–404.

* cited by examiner

METHOD OF RETAINING MEMORY STATE IN A PROGRAMMABLE CONDUCTOR RAM

This application is a continuation application of patent application Ser. No. 09/941,648, filed Aug. 30, 2001 now U.S. Pat. No. 6,646,902, the entirety of which is incorporated herein by reference.

FIELD OF THE INVENTION

The present invention relates to the field of integrated circuits and, in particular, retaining stored states in a memory device.

BACKGROUND OF THE INVENTION

An essential semiconductor component is semiconductor memory, such as a random access memory (RAM). RAM allows the user to execute both read and write operations on memory cells. Typically, RAM devices are volatile, in that stored data is lost once the power source is disconnected or removed. Typical examples of RAM devices include dynamic random access memory (DRAM), synchronized dynamic random access memory (SDRAM) and static random access memory (SRAM).

In recent years, the memory capacity, i.e., the number and density of memory cells in memory devices have been increasing. Accordingly, the size of each cell (including storage capacitor size) has been shrinking, which also shortens the cell's data holding time. Typically, a memory device receives a stabilizing request command in the conventional standardized cycle, about every 100 milliseconds. However, with increasing cell number and density, it is becoming more and more difficult to stabilize all memory cells at least once within the stabilizing cycle.

DRAMS and SDRAMs are volatile in the sense that the stored data, typically in the form of charged and discharged capacitors contained in memory cells arranged in a large array, will dissipate the charge after a relatively short period of time because of a charge's natural tendency to distribute itself into a lower energy state. DRAM is particularly volatile in that it should be stabilized, i.e., recharged, typically every 100 milliseconds, in order to retain information stored on its memory cells.

Recently, studies have been conducted on the use of chalcogenide glasses as non-volatile memory cells in the semiconductor industry. One such non-volatile memory device, which uses chalcogenide glass non-volatile memory cells is known as a programmable conductor RAM (PCRAM). Chalcogenide glasses typically comprise selenium (Se), sulfur (S) and tellurium (Te). Two mechanisms are responsible for the operation of the chalcogenide glasses as non-volatile memory elements: (1) phase change and (2) ionic conductor dendrite formation. The phase change mechanism is the most studied and relates to the formation of a crystalline filament during application of a potential across two electrodes placed around a chalcogenide material. This crystalline filament has a lower resistance than the bulk chalcogenide material. This way, a conductive path is formed between the two electrodes which basically turns the cell into a resistor. To change the state of the cell from "on" to "off" or vice-versa, a potential is again applied across the cell having a defined pulse shape, length, and amplitude, which will "melt" the crystalline conductive path and render it amorphous.

The ionic conductor dendrite formation is based on the ability of a metal-doped chalcogenide glass to maintain an amorphous state over a wide range of metal dopant concentrations. Two electrodes (cathode and anode) are formed opposite to each other and on each side of the glass, which may be a chalcogenide-metal ion composition, typically a germanium-selenium (Ge—Se) glass doped with silver (Ag), or a stable amorphous material.

When a voltage is applied to the electrodes, a conducting dendrite grows from the cathode towards the anode. When the voltage is reversed, the already formed dendrite dissolves or retracts. The growth rate of the dendrite depends upon the applied voltage and time. Although memory cells constructed with chalcogenide glasses and operated using the dendrite formation principles hold a stored value for a much longer period of time, e.g., days, than a conventional DRAM or SDRAM cell, (which rely on capacitors to store charge), it has been found that a grown dendrite may begin to decay.

There is a need for a method of stabilizing non-volatile chalcogenide memory cells, such as PCRAM cells.

BRIEF SUMMARY OF THE INVENTION

The present invention relates to a PCRAM device and a method of retaining memory therein. The above and other features and advantages of the invention are achieved by programming a non-volatile memory cell comprising a metal doped glass layer by applying a first voltage across the cell and periodically stabilizing the memory cell by applying a second voltage, which is less than the first voltage across the cell.

In an exemplary embodiment a read-out voltage is used for stabilizing the cell, but the stabilizing voltage and read voltage may also be separate voltages. The voltage used for stabilizing the cell may be applied as a sweep, pulse or step voltage. The voltage used for stabilizing the cell may also be applied continuously.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that various structural, logical and electrical changes may be made without departing from the spirit or scope of the invention.

The term "substrate" used in the following description may include any supporting structure including but not limited to a semiconductor substrate that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged. Similarly, the terms "germanium" and "selenium" are intended to include not only elemental germanium and selenium, but germanium and selenium with other trace metals or in various alloyed combinations with other metals as known in the semiconductor industry, as long as such germanium or selenium alloy is conductive, and as long as the physical and electrical properties of the germanium or selenium remain unchanged.

The present invention relates to a programmable conductor memory cell and a method and apparatus for retaining its memory state. The present invention will be described as set forth in an exemplary embodiment illustrated in FIGS. 1–6 in the context of a random access memory. However, it should be understood that the invention may be used in other types of memory devices. Also, other embodiments may be used and structural or logical changes may be made to the described and illustrated embodiment without departing from the spirit or the scope of the present invention.

Figure 1:
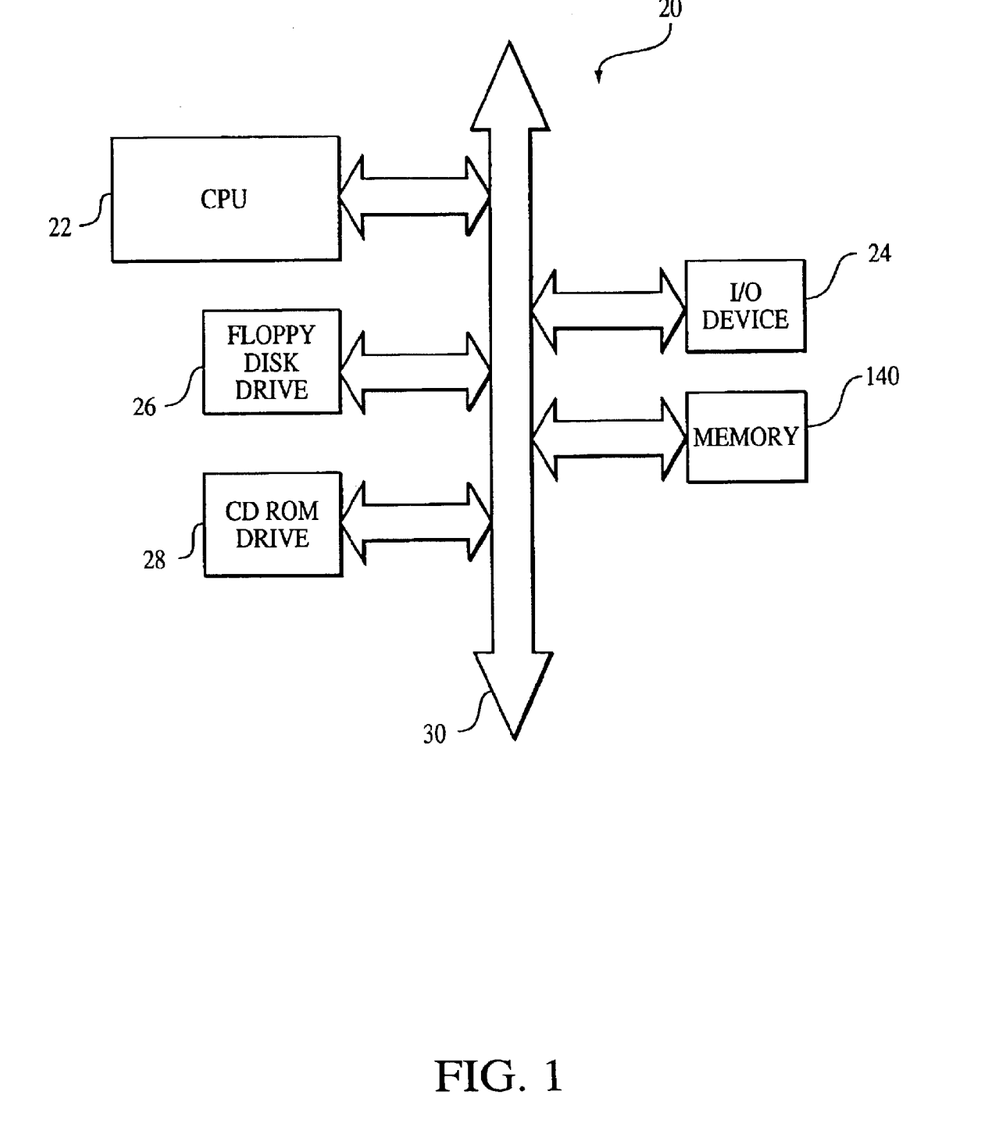
FIG. 1 illustrates a computer system having one or more memory devices that contains non-volatile memory cells according to the present invention.

FIG. 1 is a block diagram of a processor system 20 that includes a memory circuit 140, which includes one or more integrated circuit memory devices containing PCRAM non-volatile memory cells. A processor system, such as a computer system, generally comprises a central processing unit (CPU) 22, such as a microprocessor, a digital signal processor, or other programmable digital logic device, which communicates directly or indirectly with one or more input/output (I/O) devices 26 over one or more buses 30. The memory circuit 140 communicates with the central processing unit 22 directly or through a memory conductor and over one or more busses 30.

Figure 2:
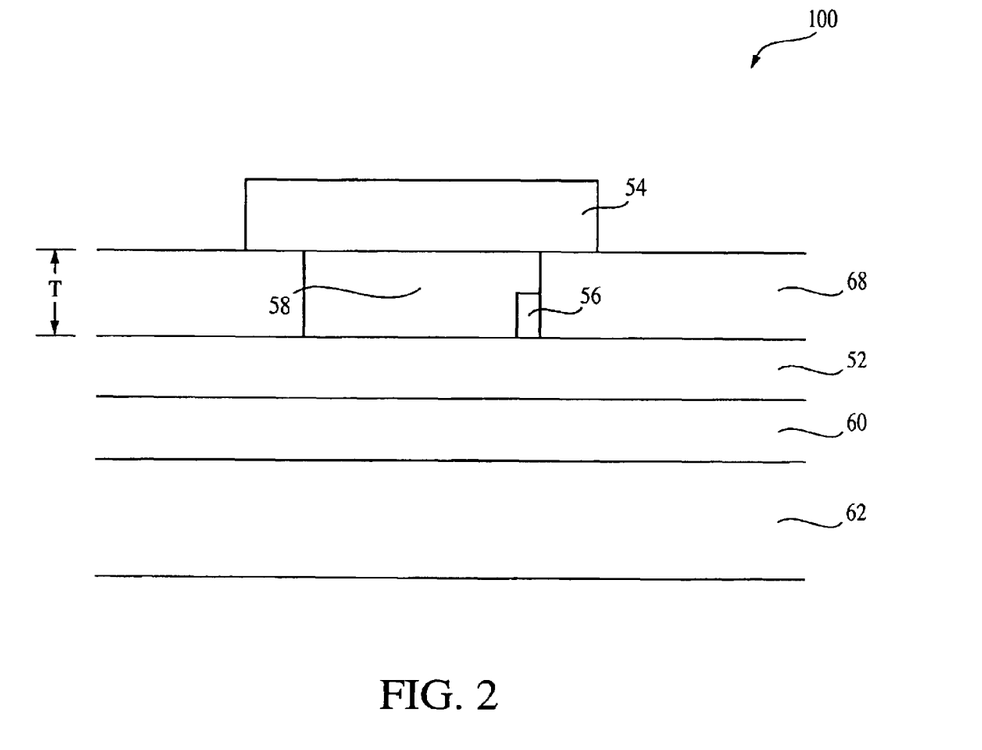
FIG. 2 is a cross-sectional view of a non-volatile memory cell according to an embodiment of the present invention.

In the case of a computer system, the processor system may include peripheral devices such as a floppy disk drive 26 and a compact disk read only memory (CD ROM) drive 28, which also communicate with CPU 22 over the bus 30. Memory circuit 140 is preferably constructed as one or more integrated circuit memory devices, each of which includes one or more PCRAM non-volatile memory cells 100 (FIG. 2). If desired, the memory circuit 140 may be combined with the processor, for example CPU 22, in a single integrated circuit.

FIG. 2 illustrates the construction of a PCRAM non-volatile memory cell. Non-volatile memory cells 100 in accordance with the present invention are generally fabricated over a semiconductor substrate 62 and comprise a first insulating layer 60 formed over a substrate 62, a first metal electrode 52 is formed on the first insulating layer 60, a second insulating layer 68 is formed on the first electrode 52, and a metal doped glass 58 is disposed in an opening in the second layer such that the metal doped glass 58 is in contact with the first electrode 52. A second metal electrode 54 is formed in contact with the metal doped glass 58.

The metal doped glass 58 may be formed over the first electrode 52 to dimensions (i.e., length, thickness, and width) suitable to produce desired electrical characteristics of the non-volatile memory cell 100. In an exemplary embodiment, the metal doped glass 58 comprises a silver-doped germanium-selenium chalcogenide glass.

The first insulating layer 60 may be formed of a conventional insulating oxide, such as silicon oxide ($SiO_2$), or a low dielectric constant material such as, for example, polyimide, spin-on-polymers (SOP), parylene, flare, polyarylethers, polytetrafluoroethylene, benzocyclobutene (BCB), SILK, fluorinated silicon oxide (FSG), NANOGLASS or hydrogen silsesquioxane, among others. The present invention is not limited, however, to the above-listed materials and other insulating and/or dielectric materials known in the industry may be used. The first insulating layer 60 may be formed by any known deposition methods, such as sputtering by chemical vapor deposition (CVD), plasma enhanced CVD (PECVD) or physical vapor deposition (PVD), among others.

The second insulating layer 68 may be formed, for example, between the first electrode 52 and the second electrode 54. The second insulating layer 68 may be formed by any known deposition methods, such as sputtering by chemical vapor deposition (CVD), plasma enhanced CVD (PECVD) or physical vapor deposition (PVD), among others. The second insulating layer 68 may comprise any suitable insulating material that provides a diffusion barrier for metals, such as silver, in the metal-doped glass. A preferred insulating material is silicon nitride, but those skilled in the art will appreciate that there are numerous suitable insulating materials.

The thickness T of the second insulating layer 68 is preferably about 500 Angstroms. The electrodes 52, 54 may comprise any suitable conductive material. The cathode or first electrode 52 is preferably tungsten. The second electrode 54 preferably comprises a silver containing metal and is more preferably silver metal.

When a voltage is applied to the electrodes 52, 54, a metal dendrite 56 grows from the first electrode 52 towards the second electrode 54. The dendrite 56 will continue to grow until the dendrite electrically shorts the electrodes 52, 54. When the voltage is reversed, the dendrite 56 retracts towards the first electrode 52 and little or no dendrite 56 will grow from the second electrode 54. In this way a cell may store a resistance value in the form of a grown dendrite or the absence of a dendrite.

The growth rate of the dendrite 56 depends upon the value of the voltage applied and the rate or length of time the voltage is applied. Generally, low voltages result in relatively slow growth rates whereas higher voltages result in more rapid growth rates. Changes in the length of the dendrite 56 affect the impedance of the non-volatile memory cell 100. When the voltage is removed from the electrodes 52, 54, the metal dendrite 56 remains intact for relatively long periods of time.

Although the embodiments described above refer to the formation of only one non-volatile memory cell 100, it should be understood that the present invention contemplates the formation of any number of such non-volatile memory cells, which can be formed as one or more memory cell arrays.

Figure 3:
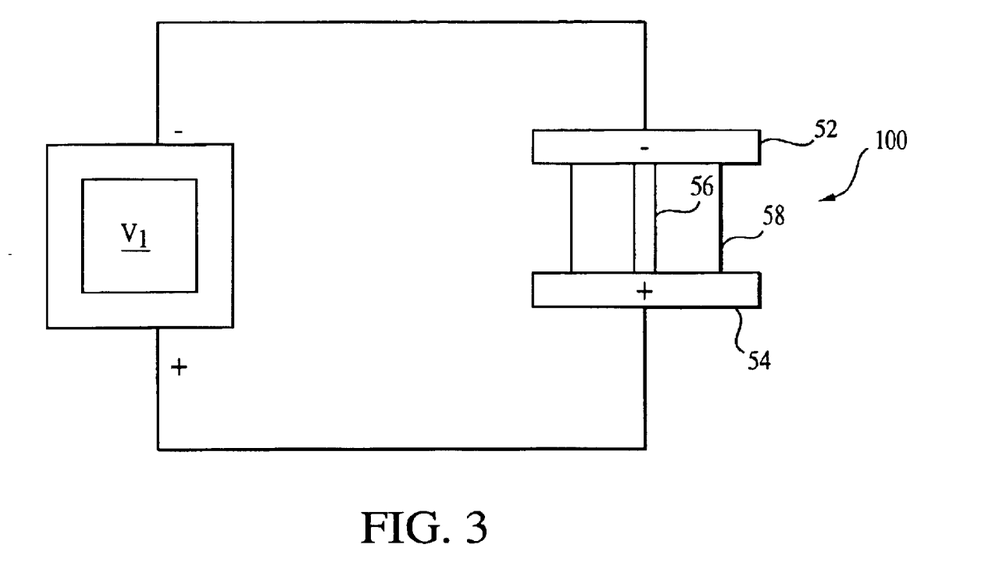
FIG. 3 is a diagram of a program circuit according to the present invention.

Referring now to FIG. 3, a PCRAM program or "write" circuit is illustrated. A first voltage $V_1$ is applied to the circuit to write information into the non-volatile memory cell 100. Application of the first voltage $V_1$ will cause the dendrite 56 to grow from the first electrode 52 towards the second electrode 54, as described above. In an exemplary embodiment of the present invention $V_1$ is greater than a threshold voltage required to begin dendrite growth and in an exemplary embodiment $V_1$ is about 0.25V. Generally any voltage higher than the predetermined threshold voltage required to begin dendrite growth will cause growth of the dendrite 56.

A grown dendrite 56 may remain intact for hours or even days. However over time, it has been found that the dendrite will begin to retract or dissolve and thus change the impedance characteristics of the cell 100 adversely affecting the memory storing capabilities of the cell 100. In accordance with the present invention, there is provided a method and circuitry for maintaining the stored state associated with a grown dendrite 56 in the non-volatile chalcogenide memory cell 100. The method and circuitry provides a stabilizing voltage for stabilizing selected cells in a memory array as wells as an entire array of memory cells. The term "maintaining" also relates to stabilizing and/or retaining dendrite growth.

Figure 4:
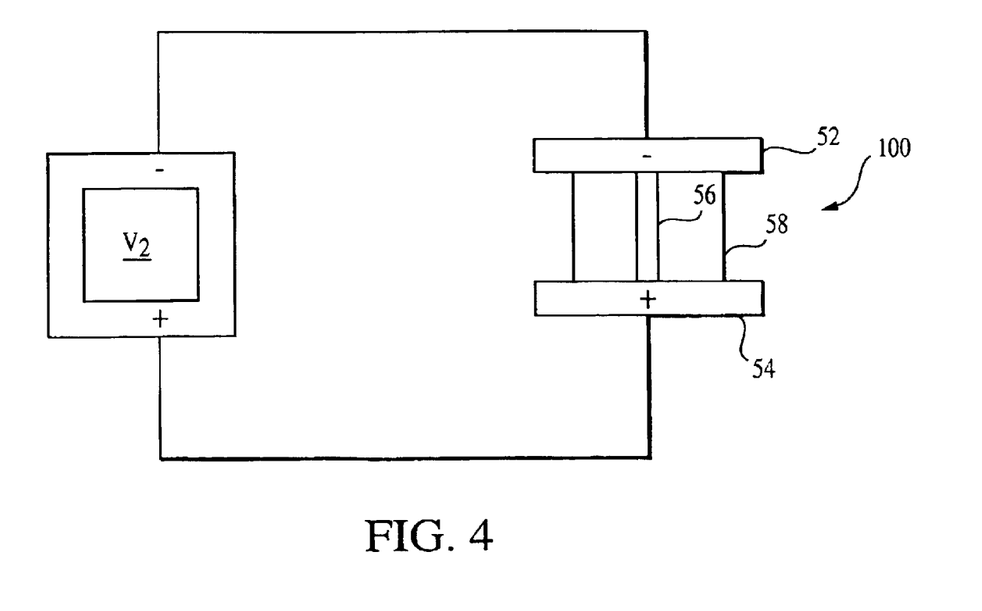
FIG. 4 is a diagram of a stabilizing circuit according to the present invention.

Referring now to FIG. 4, the stabilizing voltage is a voltage lower than the threshold voltage required to initiate dendrite growth and is termed a sub-threshold voltage. By stabilizing the cell 100 with a sub-threshold voltage $V_2$ applied across the electrodes 52, 54, which is lower than the threshold voltage required to initiate dendrite growth, and thus is also lower than the first voltage $V_1$, the stored state of the memory cell is maintained. When the second or sub-threshold voltage $V_2$ is applied via electrodes 52, 54 to the cell having a grown dendrite, it will maintain the dendrite growth and effectively act as the cell 100 stabilizing signal. The sub-threshold voltage $V_2$ does not disturb the cell 100, which has no grown dendrite that is in the "OFF" (high R) state, since the voltage $V_2$ is lower than the threshold voltage needed to initiate dendrite growth. An exemplary stabilizing sub-threshold voltage $V_2$ is in the range of 35% to 60% of the threshold voltage. For a cell, which uses $V_1$ of 0.25V for dendrite growth, an exemplary sub-threshold voltage $V_2$ is between about 0.09V to about 0.13V. The voltage sub-threshold $V_2$ may be provided as a sweep voltage, a pulse voltage, or a step voltage.

In accordance with an exemplary embodiment of the present invention, a memory cell 100 is provided as a PCRAM memory cell having a chalcogenide glass element. The memory cell 100 is programmed with a first voltage $V_1$ of about 0.25V and the second stabilizing voltage $V_2$ is, as noted, between about 0.09V and about 0.13V. If the voltage $V_2$ is applied as a sweep voltage, a linear sweep voltage signal is provided from a first magnitude $V_1$ of about 0.09V to a second magnitude $V_h$ of about 0.13V, and preferably is provided as a triangular wave sweep voltage signal. The voltage sweep is applied across electrodes 52, 54 and involves increasing the applied voltage across the entire cell array at once to generate current-voltage over the period of time involved in carrying out the sweep. Such voltage sweeps may then be periodically repeated.

By applying a stabilizing cycle according to the invention, the stored state of the memory cell 100 is retained for extended periods of time between stabilizing sub-threshold voltage $V_2$ applications. The stored state of the cell 100 may remain in tact for minutes, hours or days. For instance, the voltage application may provide for stored states in a PCRAM device that are retained for over 40 or even 65 hours.

In another embodiment, the stabilizing sub-threshold voltage $V_2$ may be applied continuously to the cell 100, selected cells in an array of memory cells, or to an entire array of cells. For instance, the voltage $V_2$ may be a continuously applied sweep voltage, pulse voltage, or step voltage.

Figure 5:
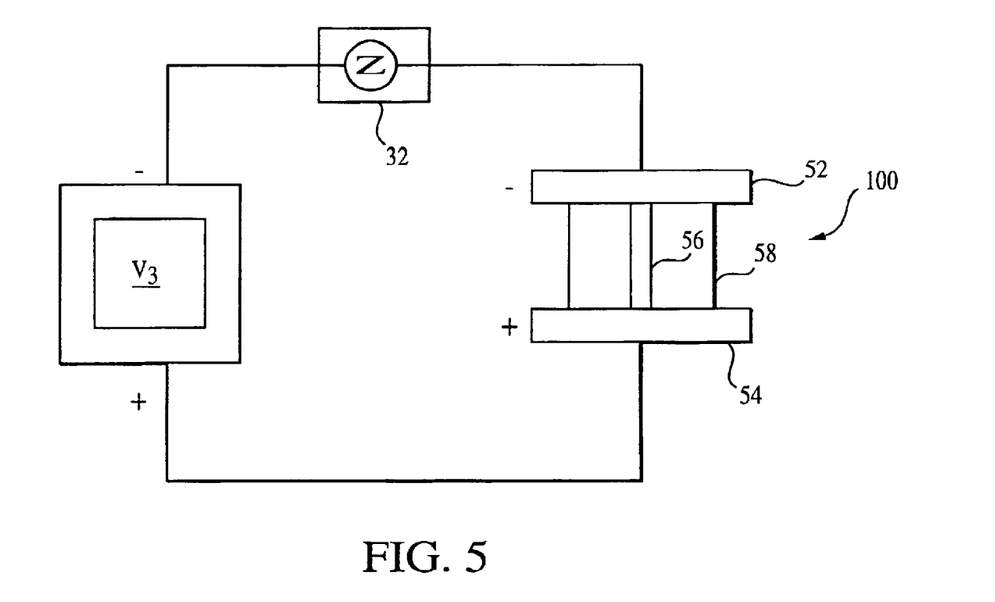
FIG. 5 is a diagram of a read-out circuit according to the present invention.

Referring now to FIG. 5, a read operation may be performed by read-selecting a cell, providing a read-out voltage $V_3$ and reading data out at the output of the current sensing amplifier 32. A third voltage source is provided for applying a read-out voltage across the electrodes 52, 54. The read out voltage $V_3$, permits the resistance of the cell 100 to be sensed. The resistance will determine the current sensed by the sense amplifier 32, which is operated to output a "0" or "1" logic level depending on the sensed current during a read operation. The read-out voltage $V_3$ may be the same as or lower than the sub-threshold voltage $V_2$. A voltage from greater than 0 to about 0.13V may be used for the read-out operation.

It has been discovered that a read-out voltage of between about 0.09V to about 0.13V applied to a memory cell or cell array will essentially act as a stabilizer and allow a memory device to retain its stored state for extended periods of time. Thus, in accordance with another exemplary embodiment of the present invention, a read-out voltage of between about 0.09V to about 0.13V is used for read out and to retain the stored memory state of the memory cell and thus alleviates the need for a stabilizing cycle. Accordingly, the read-out voltage $V_3$ does not disturb cells 100, which have no grown dendrite that are in the "OFF" (high R) state, since the voltage $V_3$ is lower than the threshold voltage needed to initiate dendrite growth. The read-out voltage may be applied to the cell, selected cells in an array of memory cells, or to an entire array. The read-out voltage may also be applied as a sweep voltage, pulse voltage, or step voltage.

Figure 6:
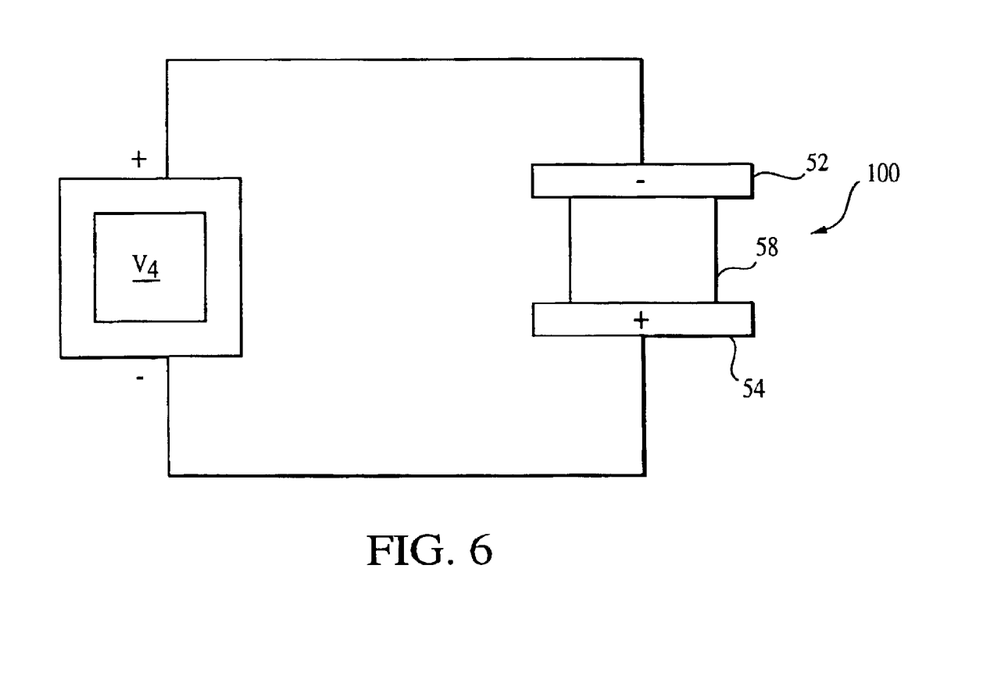
FIG. 6 is a diagram of an erase circuit according to the present invention.

Referring now to FIG. 6, applying the appropriate voltages across the electrodes for an appropriate time period generally carries out erasing memory cells in array 12. In accordance with the present invention a voltage having an opposite polarity from the write or programming voltage is applied from the first electrode 52 to the second electrode 54 to erase the memory cell. Thus, a negative voltage is applied across the second electrode 54, which causes the dendrite 56 to retract towards the first electrode 52. The amount of charge residing on the cell determines the voltage requirement. Conduction between the electrodes 52, 54 represents an "on" or erased state of the device and corresponds to a logic value of one. An exemplary erase operation may be performed by providing a negative erase voltage $V_{pp}$ from about 0 to $-1V$ with a 20 $\mu A$ compliance current. Alternatively, a high current erase, having a 1 mA compliance current, may be used.

The above description and drawings are only to be considered illustrative of exemplary embodiments, which achieve the features and advantages of the present invention. Modification and substitutions to specific process conditions and structures can be made without departing from the spirit and scope of the present invention. For instance, the applied voltages may be applied as absolute voltages or differential voltages, so long as the preferred voltage magnitudes are provided across the cell. Accordingly, the invention is not to be considered as being limited by the foregoing description and drawings, but is only limited by the scope of the appended claims.

What is claimed as new and desired to be protected by Letters Patent of the United States is:

1. A method of operating a memory cell which stores data according to a changed electrical property thereof, the method comprising:

applying a stabilizing voltage to the cell which has a magnitude less than a predetermined voltage required to program the cell to a programmed electrical property state, wherein the stabilizing voltage is effective to maintain the programmed state of the cell when the cell is in the programmed state.

2. The method according to claim 1, wherein the electrical property is the resistance of the cell.

3. The method according to claim 1, wherein the stabilizing voltage is in the range of about 35% to about 60% of the predetermined voltage.

4. The method according to claim 1, further comprising repeating the application of the stabilizing voltage to the cell according to a periodic cycle.

5. The method according to claim 1, wherein the stabilizing voltage is applied continuously to the cell.

6. The method according to claim 5, wherein the stabilizing voltage is a continuously applied sweep voltage.

7. The method according to claim 6, wherein the sweep voltage is a triangular wave sweep voltage.

8. The method according to claim 5, wherein the stabilizing voltage is a continuously applied pulse voltage.

9. The method according to claim 5, wherein the stabilizing voltage is a continuously applied step voltage.

10. The method according to claim 1, further comprising programming the cell to the programmed state by applying the predetermined voltage to the cell.

11. The method according to claim 10, further comprising applying an erase voltage to the cell to reverse the programming effected by the application of the predetermined voltage to the cell.

12. The method according to claim 10, wherein programming the cell by applying the predetermined voltage changes the cell from a first resistance state to a second resistance state.

13. The method according to claim 12, further comprising applying an erase voltage to the cell to change the cell from the second resistance state to the first resistance state.

14. The method according to claim 1, further comprising reading a value represented by the resistance state of the cell, by applying a read voltage to the cell.

15. The method according to claim 1, wherein the stabilizing voltage is a read out voltage.

16. The method according to claim 1, wherein the stabilizing voltage is a sweep voltage.

17. The method according to claim 16, wherein the sweep voltage is a triangular wave sweep voltage.

18. The method according to claim 16, wherein the stabilizing sweep voltage ranges between about 0.09 volts and about 0.13 volts.

19. The method according to claim 1, wherein the stabilizing voltage is a pulse voltage.

20. The method according to claim 1, wherein the stabilizing voltage is a step voltage.

21. A method of operating an array of programmable conductor memory cells, wherein each memory cell stores data according to a changed electrical property thereof, comprising:

applying a stabilizing voltage to the array, the stabilizing voltage having a magnitude less than a predetermined voltage required to program a cell in the array to a programmed electrical property state, wherein the stabilizing voltage is effective to maintain the programmed electrical property state of those cells in the array which are in the programmed electrical property state.

22. The method according to claim 21, wherein the electrical property is the resistance of the cell.

23. The method according to claim 21, wherein the stabilizing voltage is in the range of about 35% to about 60% of the predetermined voltage.

24. The method according to claim 21, further comprising repeating the application of the stabilizing voltage to the array according to a periodic cycle.

25. The method according to claim 21, wherein the stabilizing voltage is applied continuously to the array.

26. The method according to claim 25, wherein the stabilizing voltage is a continuously applied sweep voltage.

27. The method according to claim 26, wherein the sweep voltage is a triangular wave sweep voltage.

28. The method according to claim 25, wherein the stabilizing voltage is a continuously applied pulse voltage.

29. The method according to claim 25, wherein the continuously applied stabilizing voltage is a step voltage.

30. The method according to claim 21, further comprising programming at least one cell in the array to the programmed state by applying to each of the at least one cell the predetermined voltage required to program a cell in the array.

31. The method according to claim 30, further comprising applying an erase voltage to at least one programmed cell in the array to reverse the programming effected by the application of the predetermined voltage to the at least one programmed cell.

32. The method according to claim 30, wherein programming at least one cell in the array by applying the predetermined voltage changes each of the at least one cell from a first resistance state to a second resistance state.

33. The method according to claim 32, further comprising applying an erase voltage to at least one programmed cell in the array to change each of the at least one programmed cell from the second resistance state to the first resistance state.

34. The method according to claim 21, further comprising, for at least one cell in the array, reading a value represented by the state of the respective cell, by applying a read voltage to the respective cell.

35. The method according to claim 21, wherein the stabilizing voltage is a read out voltage for reading a stored value of in each of at least one cell in the array.

36. The method according to claim 21, wherein the stabilizing voltage is a sweep voltage.

37. The method according to claim 36, wherein the sweep voltage is a triangular wave sweep voltage.

38. The method according to claim 36, the stabilizing sweep voltage ranges between about 0.09 volts and about 0.13 volts.

39. The method according to claim 21, wherein the stabilizing voltage is a pulse voltage.

40. The method according to claim 21, wherein the stabilizing voltage is a step voltage.

41. A memory structure comprising:

a memory cell including material capable of being programmed to and holding a changed electrical property state by a predetermined voltage applied to the cell;

a first voltage source which is configured to apply the predetermined voltage to the cell to program the cell to the programmed state; and a second voltage source which is configured to apply a stabilizing voltage to the cell to maintain the programmed state of the cell when the cell is in the programmed state, wherein the stabilizing voltage applied by the second voltage source has a magnitude less than the predetermined voltage applied by the first voltage source and the stabilizing voltage is not used for reading a value stored in the cell.

42. The memory structure according to claim 41, wherein the electrical property is the resistance of the cell.

43. The memory structure according to claim 41, wherein the second voltage source is configured to apply the stabilizing voltage as a voltage in the range of about 35% to about 60% of the predetermined voltage applied by the first voltage source.

44. The memory structure according to claim 41, wherein the second voltage source is configured to repeatedly apply the stabilizing voltage to the cell according to a periodic cycle.

45. The memory structure according to claim 41, wherein the second voltage source is configured to continuously apply the stabilizing voltage to the cell.

46. The method according to claim 45, wherein the second voltage source is configured to apply the stabilizing voltage as a continuous sweep voltage.

47. The method according to claim 46, wherein the second voltage source is configured to apply the stabilizing voltage as a continuous triangular wave sweep voltage.

48. The method according to claim 45, wherein the second voltage source is configured to apply the stabilizing voltage as a continuous pulse voltage.

49. The method according to claim 45, wherein the second voltage source is configured to apply the stabilizing voltage as a continuous step voltage.

50. The memory structure according to claim 45, further comprising a third voltage source which is configured to apply an erase voltage to the cell, wherein the erase voltage applied by the third voltage source reverses the programming effected by the predetermined voltage applied to the cell by the first voltage source.

51. The memory structure according to claim 45, wherein the memory cell is capable of being programmed from a first resistance state to a second resistance state by the application of the predetermined voltage to the cell by the first voltage source.

52. The memory structure according to claim 51, further comprising a third voltage source which is configured to apply an erase voltage to the cell, wherein the erase voltage applied by the third voltage source changes the resistance state of the cell from the second resistance state to the first resistance state.

53. The memory structure according to claim 45, further comprising a third voltage source which is configured to apply a read voltage to the cell to read a value represented by the resistance state of the cell.

54. The method according to claim 45, wherein the second voltage source is configured to apply the stabilizing voltage as a read out voltage.

55. The memory structure according to claim 45, wherein the second voltage source is configured to apply the stabilizing voltage as a sweep voltage.

56. The memory structure according to claim 55, wherein the second voltage source is configured to apply the stabilizing voltage as a triangular wave sweep voltage.

57. The memory structure according to claim 55, wherein the first voltage source is configured to apply the predetermined voltage at about 0.24 volts and the second voltage source is configured to apply the stabilizing sweep voltage between a range of about 0.09 volts and about 0.13 volts.

58. The memory structure according to claim 45, wherein the second voltage source is configured to apply the stabilizing voltage as a pulse voltage.

59. The memory structure according to claim 45, wherein the second voltage source is configured to apply the stabilizing voltage as a step voltage.

60. A memory device comprising:
an array of memory cells in which each cell includes material capable of being programmed to and holding a changed electrical property state by a predetermined voltage applied to the cell;
a first voltage source which is configured to individually apply the predetermined voltage to each cell in the array, and wherein the first voltage source is further configured, upon selection of at least one cell in the array which is not in the programmed state, to program to the programmed state each cell selected to be programmed; and
a second voltage source which is configured to apply a stabilizing voltage to the array to maintain the programmed state of each cell in the array which is in the programmed state, wherein the stabilizing voltage applied by the second voltage source has a magnitude less than the predetermined voltage applied by the first voltage source and the stabilizing voltage is not used for reading a value stored in any of the cells in the array.

61. The method according to claim 60, wherein the electrical property is the resistance of the cell.

62. The memory device according to claim 60, wherein the second voltage source is configured to apply the stabilizing voltage as a voltage in the range of about 35% to about 60% of the predetermined voltage applied by the first voltage source.

63. The memory device according to claim 60, wherein the second voltage source is configured to repeatedly apply the stabilizing voltage to the array according to a periodic cycle.

64. The memory device according to claim 60, wherein the second voltage source is configured to continuously apply the stabilizing voltage to the array.

65. The method according to claim 64, the second voltage source is configured to apply the stabilizing voltage as a continuous sweep voltage.

66. The method according to claim 65, wherein the second voltage source is configured to apply the stabilizing voltage as a continuous triangular wave sweep voltage.

67. The method according to claim 64, wherein the second voltage source is configured to apply the stabilizing voltage as a continuous pulse voltage.

68. The method according to claim 64, wherein the second voltage source is configured to apply the stabilizing voltage as a continuous step voltage.

69. The memory device according to claim 60, further comprising a third voltage source which is configured to individually apply an erase voltage to each cell in the array, wherein the third voltage source is further configured, upon selection of at least one programmed cell in the array, to reverse the programming effected by the predetermined voltage applied by the first voltage source to each selected programmed cell.

70. The memory device according to claim 60, wherein each cell in the array is capable of being programmed from a first resistance state to a second resistance state by the application of the predetermined voltage to the respective cell in the array by the first voltage source.

71. The memory structure according to claim 70, further comprising a third voltage source which is configured to individually apply an erase voltage to each cell in the array, wherein the third voltage source is further configured, upon selection of at least one programmed cell in the array, to change the resistance state of each selected programmed cell from the second resistance state to the first resistance state.

72. The memory structure according to claim 60, further comprising a third voltage source which is configured to individually apply a read voltage to each cell in the array, wherein the third voltage source is further configured, upon selection of at least one cell in the array to be read, to read a value respectively represented by the resistance state of each cell selected to be read.

73. The method according to claim 60, wherein the second voltage source is configured to apply the stabilizing voltage as a read out voltage for reading a stored value of in each of at least one cell in the array.

74. The memory structure according to claim 60, wherein the second 52 voltage source is configured to apply the stabilizing voltage as a sweep voltage.

75. The memory structure according to claim 74, wherein the second 52 voltage source is configured to apply the stabilizing voltage as a triangular wave sweep voltage.

76. The memory device according to claim 74, wherein the first voltage source is configured to apply the predetermined voltage at about 0.24 volts and the second voltage source is configured to apply the stabilizing sweep voltage between a range of about 0.09 volts and about 0.13 volts.

77. The memory structure according to claim 60, wherein the second voltage source is configured to apply the stabilizing voltage as a pulse voltage.

78. The memory structure according to claim 60, wherein the second voltage source is configured to apply the stabilizing voltage as a step voltage.

79. A method of operating a programmable memory cell, comprising:

programming the cell by applying the predetermined voltage to the cell to thereby change an electrical property of the cell;

applying a stabilizing voltage to the cell which has a magnitude less than the predetermined voltage required to program the cell to a programmed state, wherein the stabilizing voltage is effective to maintain the programmed state of the cell;

applying a read voltage to the cell; and applying an erase voltage to the cell to reverse the programming effected by the application of the predetermined voltage to the cell.

80. The method according to claim 79, wherein the electrical property changed by programming the cell is the electrical resistance of the cell.

81. The method according to claim 79, wherein the stabilizing voltage is applied to the cell continuously.

82. The method according to claim 81, wherein the stabilizing voltage applied to the cell is a continuous sweep voltage.

83. The method according to claim 81, wherein the stabilizing voltage applied to the cell is a continuous pulse voltage.

84. The method according to claim 81, wherein the stabilizing voltage applied to the cell is a continuous step voltage.

85. The method according to claim 79, wherein the stabilizing voltage is applied to the cell according to a periodic cycle.

* * * * *

UNITED STATES PATENT AND TRADEMARK OFFICE
CERTIFICATE OF CORRECTION

PATENT NO. : 6,813,176 B2  Page 1 of 1
APPLICATION NO. : 10/701106
DATED : November 2, 2004
INVENTOR(S) : Terry L. Gilton et al.

It is certified that error appears in the above-identified patent and that said Letters Patent is hereby corrected as shown below:

Title page,
Item [56], References Cited, OTHER PUBLICATIONS,
"El Bouchairi, B.; Bernede, J.C.; Burgaud, P., Propeties of Ag2-xSe1+x/n-Si diodes, Thin Solid Films 110 (1983) 107-113." should read -- El Bouchairi, B.; Bernede, J.C.; Burgaud, P., Properties of Ag2-xSe1+x/n-Si diodes, Thin Solid Films 110 (1983) 107-113. --; and
"Zhang, M.; Mancini, S.; Bresser, W.; Boolchang, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154." should read -- Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154. --.

Column 8,
Line 43, "claim 36, the" should read -- claim 36, wherein the --.

Column 10,
Line 30, "claim 64, the" should read -- claim 64, wherein the --.

Signed and Sealed this

Twentieth Day of June, 2006

JON W. DUDAS
*Director of the United States Patent and Trademark Office*